(12) United States Patent
Miyauchi et al.

(10) Patent No.: US 6,897,130 B2
(45) Date of Patent: May 24, 2005

(54) METHOD FOR THERMAL PROCESSING SEMICONDUCTOR WAFER WITH A FLASH DISCHARGE LAMP AFTER PREHEATING TO A PREDETERMINED TEMPERATURE

(75) Inventors: Koji Miyauchi, Hyogo (JP); Tatsushi Owada, Hyogo (JP)

(73) Assignee: Ushio Denki Kabushiki Kaisya, Tokyo (JP)

( * ) Notice: Subject to any disclaimer, the term of this patent is extended or adjusted under 35 U.S.C. 154(b) by 0 days.

(21) Appl. No.: 10/318,094

(22) Filed: Dec. 13, 2002

(65) Prior Publication Data

US 2003/0114019 A1 Jun. 19, 2003

(30) Foreign Application Priority Data

Dec. 13, 2001 (JP) .................................... 2001-379762

(51) Int. Cl.[7] .................. H01L 21/20; H01L 21/36; H01L 21/26; H01L 21/42; H01L 21/324
(52) U.S. Cl. ..................... 438/502; 438/509; 438/795
(58) Field of Search ........................... 438/308, 466, 438/502, 509, 799

(56) References Cited

U.S. PATENT DOCUMENTS 4,571,486 A * 2/1986 Arai et al. ............... 438/799

FOREIGN PATENT DOCUMENTS

| JP | 57-80729 | 5/1982 |
| JP | 57-162340 | 10/1982 |
| JP | 2002-57301 | 2/2002 |
| JP | 2002-198322 | 7/2002 |

* cited by examiner

Primary Examiner—William M. Brewster
(74) Attorney, Agent, or Firm—Oblon, Spivak, McClelland, Maier & Neustadt, P.C.

(57) ABSTRACT

The present invention provides a method for thermal processing a semiconductor wafer wherein the semiconductor wafer is heat-treated by means of flash radiation means constituted by a flash discharge lamp after preheating the semiconductor wafer to a predetermined temperature by means of preheating means, the preheating is performed at a preheating temperature capable of controlling that the maximum tension of the semiconductor wafer when heated by the flash radiation means is to be less than the tense strength of the semiconductor wafer itself.

2 Claims, 14 Drawing Sheets

METHOD FOR THERMAL PROCESSING SEMICONDUCTOR WAFER WITH A FLASH DISCHARGE LAMP AFTER PREHEATING TO A PREDETERMINED TEMPERATURE

BACKGROUND OF THE INVENTION

1. Field of the Invention

The present invention relates to a method for thermal processing a semiconductor wafer.

2. Description of the Related Art

A process for fabricating semiconductor device comprises a step of forming an impurity diffusion layer in the region of the surface layer of the semiconductor wafer, wherein the layer is formed by introducing an impurity by means of ion implantation into a silicon crystal in the region of the semiconductor wafer surface layer, for example, and then thermal processing the semiconductor wafer in this condition at or above 1000° C. for example to activate the impurity.

FIG. 14 is an illustrative cross-sectional view emphasizing the structure of a transistor element formed in a semiconductor wafer. The semiconductor wafer has silicon oxide films ($SiO_2$) 62, 62 embedded in a P type silicon substrate 61 so as to form a region separating from the element thereof, for example, and a gate electrode 66 is formed on the substrate 61, wherein the gate electrode is formed by forming a gate oxide film layer 63 on this silicon substrate 61, and then laminating a tungsten layer 65 on the gate oxide film layer 63 with a polycrystalline silicon layer 64 lying between the gate oxide film layer 63 and the tungsten layer 65. So-called silicon nitride film sidewall spacers 67, 67 are formed on either side of the gate electrode 66. In the figure, 68, 68 indicate ion implantation regions of electrodes, either one of these electrodes is the source and the other is the drain.

In the step of forming the impurity diffusion layer, when the semiconductor wafer to which impurity has been introduced is exposed to an elevated temperature for a long period, the impurity diffuses as far as a region that lies deeper than the region in which the impurity diffusion layer of the semiconductor wafer is to be formed such that the depth (thickness) of the impurity diffusion layer is considerable, and it is therefore necessary to suppress the thermal diffusion of the impurity by ensuring that the semiconductor wafer is not heated beyond what is necessary.

As a method for thermal processing the semiconductor wafer, a technique is known that employs an RTP (Rapid Thermal Process) apparatus that employs a lamp as the heat source, and that is capable of rapidly heating the semiconductor wafer being processed by irradiating the semiconductor wafer with light emitted by this heat source, and then rapidly cooling the semiconductor wafer. Halogen lamps are widely used as this RTP apparatus heat source.

However, in recent years, due to the increasing demand for high integration and increased intricacy of semiconductor integrated circuits, the need has arisen to more shallowly form the impurity diffusion layer in the range of 20 nm or less, for example. Such a demand cannot be adequately met by means of a thermal processing method that employs an RTP apparatus whose heat source is a halogen lamp.

As a method for forming a highly shallow impurity diffusion layer, a technique that employs an apparatus which uses a xenon chloride laser and performs thermal processing by scanning the semiconductor wafer with an irradiation width of a few millimeters using this xenon chloride laser is known. Such an apparatus is currently introduced to semiconductor device fabrication processes at a very sophisticated level but is highly costly and, because thermal processing is carried out while scanning the surface of the semiconductor wafer with a laser beam having a small spot diameter, there is the drawback that the throughput is reduced.

There have therefore been studies into the use of flash discharge lamps, which are capable of heating a product being processed in a very short time, as the heat source of the RTP apparatus. With a thermal processing method that employs an RTP apparatus whose heat source is a flash discharge lamp, flash irradiation of the processed semiconductor wafer by means of the flash discharge lamp, is completed within a very short time, and it is therefore possible to perform heating in a state where heat is transmitted only to the surface layer region and not within the semiconductor wafer, meaning that thermal diffusion of the impurity can be suppressed.

Meanwhile, a thermal processing method is widely adopted in which preheating means for preheating the semiconductor wafer to a predetermined temperature beforehand are provided for example in the RTP apparatus and the semiconductor wafer is heated by the heat source after being preheated by the preheating means.

By preheating the semiconductor wafer, the amount of energy which the heat source requires in order to heat the semiconductor wafer surface layer region to the desired temperature is reduced, and, as a result, the load on the lamp that constitutes the heat source can be reduced and the lifespan of the lamp can therefore be increased.

The preheating temperature produced by preheating means is equal to or less than 550° C. because when the temperature of the semiconductor wafer is equal to or greater than 700° C., the thermal diffusion of the impurity is considerable. In actuality, the preheating temperature is set as high as 450° C. or more for the purpose of reducing the load on the flash discharge lamp, and there are therefore frequent cases of usage in the range 450° C. to 550° C.

However, the problem exists that, in reality, the majority of semiconductor wafers which are thermal processed by being preheated and then irradiated with the flash emitted by the flash discharge lamp are damaged and break up. Further, mass production of semiconductor device fabrication is not possible by means of a thermal processing method that employs a thermal processing apparatus whose heat source is a flash discharge lamp. As a result, it has been difficult to put this thermal processing method into practical use.

As a result of extensive research with the object of putting a thermal processing method that employs a thermal processing apparatus whose heat source is a flash discharge lamp into practical use, the present inventors made the discovery that heating the semiconductor wafer causes compressive stress to be generated in the surface layer that comprises the surface irradiated with the flash from the flash discharge lamp, and in the backside layer that comprises the backside of the semiconductor wafer. However, tensile stress is generated in an intermediate layer that lies between the surface layer and backside layer, and, because the semiconductor wafer possesses the characteristic of low resistance to tensile stress in comparison with compressive stress, the semiconductor wafer is damaged as a result of the tensile stress generated in the intermediate layer.

SUMMARY OF THE INVENTION

The present invention was conceived on the basis of the above considerations, and an object thereof is to provide a method for thermal processing a semiconductor wafer which is capable of performing thermal processing without damaging the semiconductor wafer being processed.

The method for thermal processing a semiconductor wafer according to the present invention is a method for thermal processing a semiconductor wafer wherein the semiconductor wafer is heat-treated by means of flash radiation means constituted by a flash discharge lamp after preheating the semiconductor wafer to a predetermined temperature by means of preheating means, the preheating is performed by preheating means at a preheating temperature capable of controlling that the maximum tension of the semiconductor wafer, when same is heated by flash radiation means, is to be less than the tense critical strength of the semiconductor wafer itself.

For the method for thermal processing a semiconductor wafer according to the present invention, the rise rate of the irradiation waveform of a flash irradiated by flash radiation means to the semiconductor wafer is equal to or more than $2.0 \times 10^5$ J/mm$^2$·s$^2$ and the peak energy of the same is equal to or less than 200 J/mm$^2$·s. The preheating temperature by preheating means is preferably set to be equal to or less than 450° C.

The method for thermal processing a semiconductor wafer according to the present invention is a method for thermal processing a semiconductor wafer wherein the semiconductor wafer is heat-treated by means of flash radiation means constituted by a flash discharge lamp after preheating the semiconductor wafer to a predetermined temperature by means of preheating means, the preheating may be performed by preheating means at a preheating temperature capable of controlling that the maximum value of the tension of the range 0.18 to 0.28 mm from the surface of the semiconductor wafer being irradiated with the flash from flash radiation means is to be less than the tense critical strength of the semiconductor wafer itself, when same is heated by flash radiation means.

According to the method for thermal processing a semiconductor wafer according to the present invention, heating is performed by means of preheating means that control a preheating temperature such that the maximum tension of the semiconductor wafer generated by thermal expansion thereof is less than the tension critical strength of the semiconductor wafer itself, when the semiconductor wafer is heated by means of flash radiation means constituted by a flash discharge lamp after the semiconductor wafer is preheated to a predetermined temperature by means of preheating means. As a result, damage to the semiconductor wafer which arises from tension produced within the semiconductor wafer during thermal processing can be suppressed. Thermal processing that does not damage the semiconductor wafer being processed can therefore be performed.

DESCRIPTION OF SYBOLS

Figure 1:
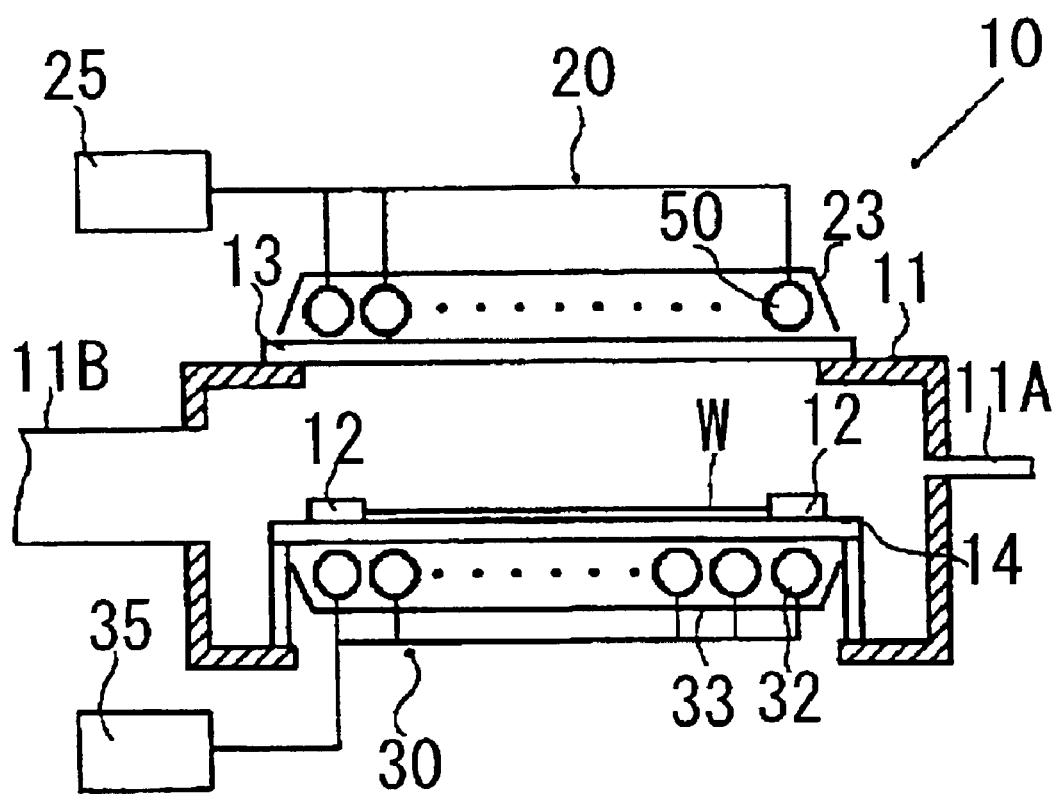
FIG. 1 is an illustrative view of an example of a thermal processing apparatus that can be suitably employed in the method for thermal processing a semiconductor wafer according to the present invention.

10 Thermal processing apparatus
11 Chamber
11A Atmospheric gas inlet
11B Semiconductor wafer outlet
12 Support
13 First quartz window
14 Second quartz window
20 Flash radiation means
23 Reflector
25 Flash discharge lamp lighting circuit
28 Trigger electrode
30 Preheating means
32 Halogen lamp
33 Reflector
35 Halogen lamp lighting circuit
41 Trigger circuit
41A Charging circuit
41B Discharging circuit
42 Switch
43 Thyristor
44 Transformer
44A Secondary coil
44B Primary coil
45 Trigger capacitor
47, 47a, 47b, 47c Capacitor
48a, 48b, 48c Waveform shaping coil
49 Common charger
50 Flash discharge lamp
51 Discharge container
55 Anode
56 Cathode
61 P type silicon substrate 62 Silicon oxide film
63 Gate oxide film layer
64 Polycrystalline silicon layer
65 Tungsten layer
66 Gate electrode
67 Sidewall spacer
68 Electrode
W Semiconductor wafer

DESCRIPTION OF THE PREFERRED EMBODIMENTS

Embodiments of the present invention will be described in detail hereinbelow.

FIG. 1 is an illustrative view of an example of a thermal processing apparatus that can be suitably employed in the method for thermal processing a semiconductor wafer according to the present invention. The thermal processing apparatus 10 is for processing a semiconductor wafer (indicated by "W" in FIG. 1), and comprises a silica glass chamber 11 provided with an atmospheric gas inlet 11A and a semiconductor wafer outlet 11B, and supports 12, 12 that are disposed in the chamber 11 and serve to support the semiconductor wafer. A first quartz window 13 formed from a quartz plate is provided at the ceiling of the chamber 11 (the upper face in FIG. 1), and a second quartz window 14 formed from a quartz plate is provided at the bottom of the chamber 11 (the lower face in FIG. 1).

Preheating means 30 are provided below the second quartz window 14 of the chamber 11 (towards the bottom of FIG. 1), and flash radiation means 20 (described subsequently) are provided as the heat source above the first quartz window 13 of the chamber 11 (towards the top of FIG. 1).

In this example, preheating means 30 are provided with a plurality of rod-shaped halogen lamps 32 that are arranged in parallel at regular intervals along the second quartz window 14, and a reflector 33 that is common to these halogen lamps, and comprises a halogen lamp lighting circuit 35 for controlling the operation of the halogen lamps 32.

According to a thermal processing apparatus 10 of this kind, when a semiconductor wafer to which an impurity has been introduced is carried into the chamber 11, thermal processing is performed by, for example, simultaneously lighting all the halogen lamps 32 of preheating means 30 beforehand, preheating the semiconductor wafer to a predetermined temperature without engendering the problem of thermal diffusion of the introduced impurity for example, and then discharging a flash by operating flash radiation means 20.

Then, the semiconductor wafer, in which an impurity diffusion layer has been formed by heating the wafer such that the surface layer region thereof is rapidly raised to an elevated temperature and then rapidly cooling the wafer, is carried out of the chamber 11 of the thermal processing apparatus 10.

Flash radiation means 20 comprise a plurality of rod-shaped flash discharge lamps 50 that are arranged in parallel at regular intervals along the first quartz window 13, and a reflector 23 that is common to these flash discharge lamps 50, and comprises a flash discharge lamp lighting circuit 25 for controlling the operation of the flash discharge lamps 50.

Figure 2:
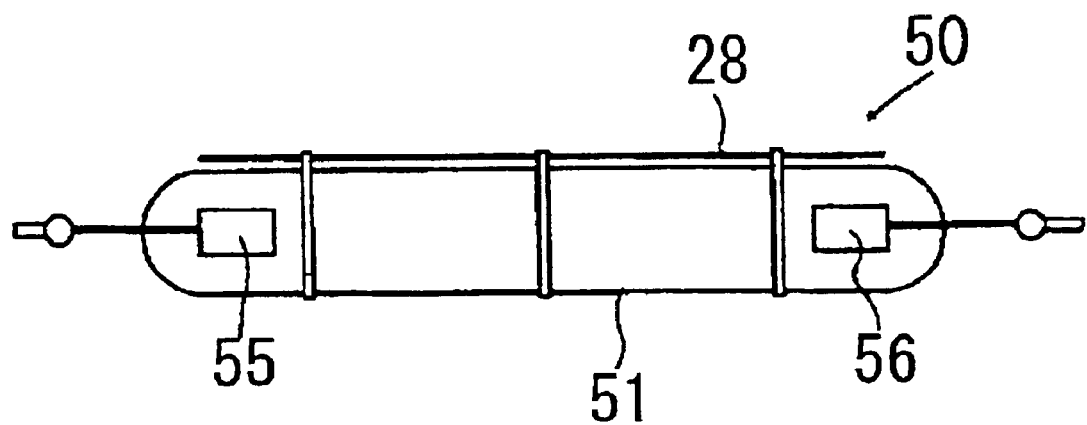
FIG. 2 is an illustrative view of the constitution of the flash discharge lamp constituting flash radiation means of FIG. 1.

As shown in FIG. 2, the flash discharge lamps 50 are charged with xenon-gas for example and sealed at both ends thereof, and comprise a straight tube type silica glass discharge container 51 the discharge space of which is internally partitioned; and an anode 55 and a cathode 56 that are arranged facing one another in the discharge space. A trigger electrode 28 disposed so as to extend in the axial direction of the tube is provided along the outside of the discharge container 51.

Figure 3:
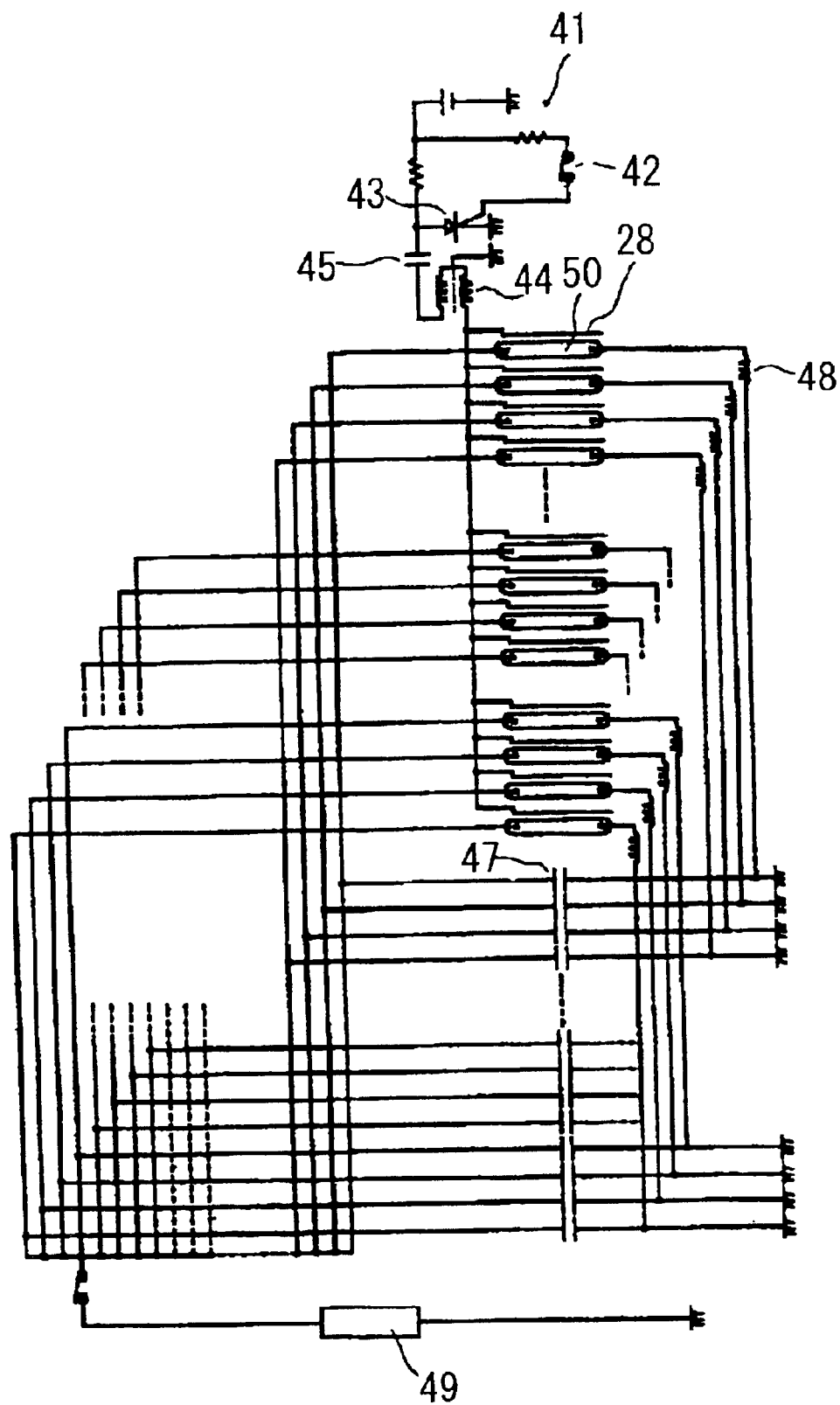
FIG. 3 is an illustrative view of a specific example of the lighting circuit of the flash discharge lamp.

In this example, the respective trigger electrode 28 of the flash discharge lamps 50 is connected to a common trigger circuit 41 (see FIG. 3).

Figure 4:
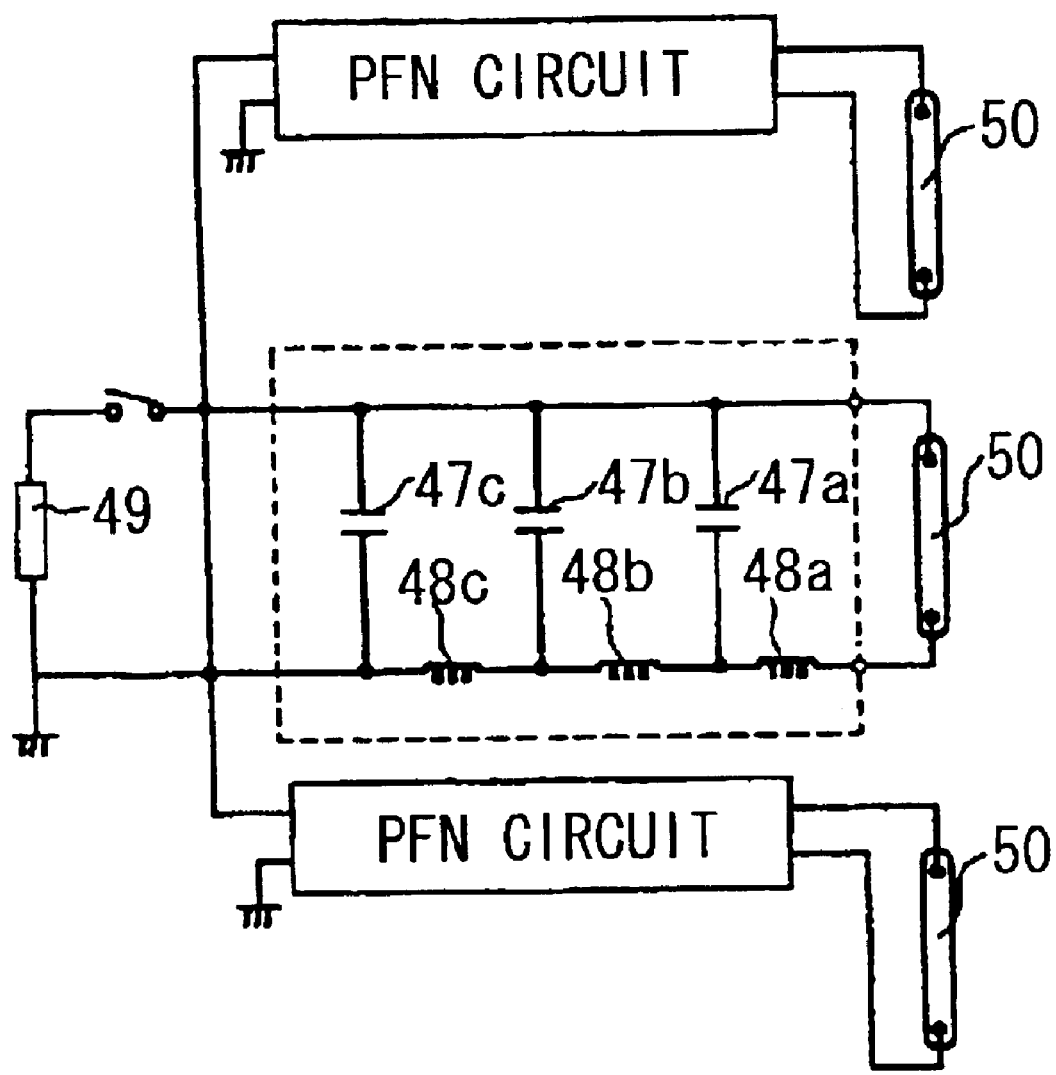
FIG. 4 is an illustrative view of a detail of charge-discharge circuit parts pertaining to one flash discharge lamp of another flash discharge lamp lighting circuit.

FIG. 3 is an illustrative view of a specific example of the lighting circuit of the flash discharge lamp. FIG. 4 is an illustrative view of a detail of charge-discharge circuit parts pertaining to one flash discharge lamp of another flash discharge lamp lighting circuit.

The lighting circuit is constituted by charge-discharge circuit parts that are provided for a plurality of flash discharge lamps 50 connected to a common charger 49.

In addition to the regulation of the voltage stored in main capacitors 47, the capacity of the main capacitors 47, and of the inductance of the waveform shaping coil 48 being performed by means for performing rectification for the required waveform as shown in FIG. 3, this regulation can also be performed by a charge-discharge circuit such as that shown in FIG. 4 in which main capacitors 47a, 47b, and 47c and waveform shaping coils 48a, 48b, and 48c are connected in multiple stages.

A certain section of the charge-discharge circuit (those parts surrounded by a dotted line in FIG. 4) is constituted by three main capacitors 47a, 47b, and 47c which are connected in parallel and serve to supply the emitted light energy, and the waveform shaping coils 48a, 48b, and 48c that pertain to the main capacitors 47a, 47b, and 47c respectively. The three waveform shaping coils are connected between the flash discharge lamp 50 and the first main capacitor 47a, and between the main capacitors, which components all pertain to the constituent parts of the circuit.

Further, of the circuit constituent parts, one end of the first main capacitor 47a and one end of the first waveform shaping coil 48a are connected to the flash discharge lamp 50, and one end of the third main capacitor 47c and one end of the third waveform shaping coil 48c are connected to the common charger 49 that serves to supply electric power to the main capacitors. A circuit that is thus constituted is known as a PFN (Pulse forming network) circuit and is employed as a lighting circuit, such as that for a camera strobe, for example.

Of the above circuit constituent parts, the electric charge of the first main capacitor 47a is discharged via the first waveform shaping coil 48a, and the electric charge of the second main capacitor 47b is discharged via the first waveform shaping coil 48a and the second waveform shaping coil 48b, meaning that the time required to discharge the second main capacitor 47b is large in comparison with that required for the first main capacitor 47a. Further, the electric charge of the third main capacitor 47c is discharged via the first waveform shaping coil 48a, the second waveform shaping coil 48b, and the third waveform shaping coil 48c, meaning that the time required to discharge the third main capacitor 47c is large in comparison with that required for the second main capacitor 47b. The irradiation waveform of flash radiation means 20 can be regulated by using these facts.

Figure 11:
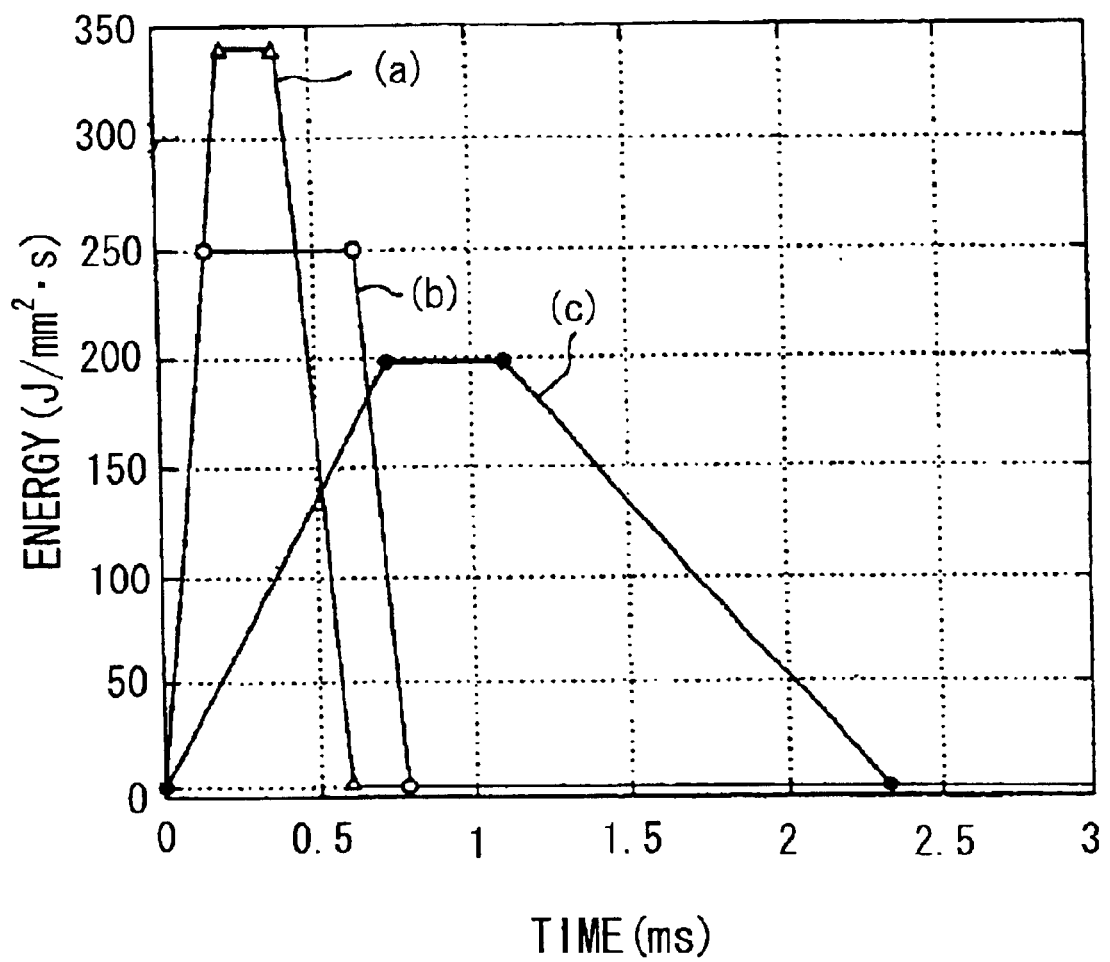
FIG. 11 is an illustrative view of irradiation waveforms of the flash with which the semiconductor wafer is irradiated by flash radiation means according to a second embodiment.

Specifically, an irradiation waveform held in a state in which the rise rate is high and the peak energy is suppressed (such as the irradiation waveform represented by curve (b) in FIG. 11 for example) can be rendered.

In this example, the PFN circuit has three stages, but it is possible to freely render the rise of the irradiation waveform as well as the peak hold time by increasing or decreasing the number of stages.

Here, the "irradiation waveform" is a function with respect to time of the energy density of the flash with which the semiconductor wafer is irradiated by flash radiation means.

Measurement involves using a pulse laser power meter or similar of a system that observes the temperature rise of a given black body by means of a pyrometer or the like, to thereby calculate the overall integrated energy, and observing the irradiation waveform by means of an optical sensor to specify the output value of each minute time interval using the integrated values for the energy.

Figure 5:
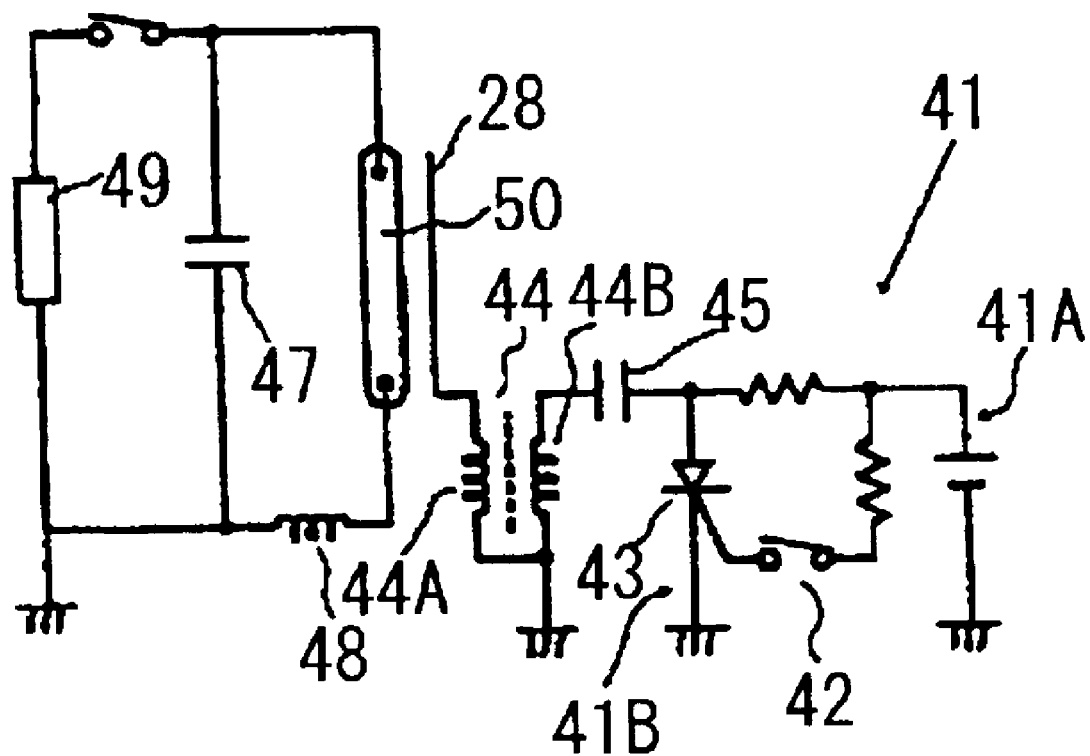
FIG. 5 is an illustrative view of a trigger circuit.

As shown in FIG. 5, the trigger circuit 41 is equipped with a transformer 44 that is constituted by a secondary coil 44A connected to the trigger electrode 28 of the flash discharge lamp 50 and a primary coil 44B connected via a trigger capacitor 45 to a charging circuit 41A and a discharging circuit 41B, and further comprises a switch 42 that functions as a drive signal generator and is operated on the basis of an irradiation command signal.

In FIG. 5, the three main capacitors and the three waveform shaping coils pertaining to the constituent parts of the circuit are respectively shown with one signal.

In flash radiation means 20 thus constituted, when the irradiation command signal is received, a drive signal is generated as a result of the switch 42 closing and conducting, and a high trigger voltage is generated in the secondary coil 44A of the transformer 44 as a result of the electric charge pre-stored in the trigger capacitor 45 being discharged via the thyristor 43. The flash discharge lamps 50 are all driven as a result of the high trigger voltage being applied to the trigger electrode 28.

The plurality of flash discharge lamps 50 therefore all light up at once as a result of being driven simultaneously on the basis of the drive signal generated by the drive signal generator.

In the thermal processing apparatus 10 which is constituted having preheating means 30 and flash radiation means 20 as detailed above, the semiconductor wafer to which an impurity has been introduced is thermal processed such that the maximum value (referred to as the "peak temperature" hereinafter) for the surface temperature during the thermal processing by means of preheating means 30 and flash radiation means 20 is equal to or greater than 1000° C. and preferably from 1000 to 1300° C.

By making the peak temperature of the semiconductor wafer equal to or greater than 1000° C., the impurity diffusion layer can be reliably formed in the surface layer region of the semiconductor wafer.

Also, because heating of the semiconductor wafer generates stress which differs depending on the site as indicated in (1) to (3) below, in the thermal processing method by means of the thermal processing apparatus 10, the preheating temperature to be attained by preheating means 30 is determined such that, after being preheated by means of preheating means 30, the maximum tension of the semiconductor wafer when same is heated by flash radiation means 20 is less than the tense critical strength of the semiconductor wafer itself.

Further, the characteristics of the flash with which the semiconductor wafer is irradiated by flash radiation means 20 are determined such that the peak temperature of the semiconductor wafer reaches the desired temperature, on the basis of the preheating temperature thus determined.

(1) When the temperature rises, the surface layer comprising the surface irradiated with the flash from flash radiation means expands due to the physical properties of the material of the semiconductor wafer, namely silicon (Si) for example, thereby producing a compressive stress.

(2) The intermediate layer, which succeeds the surface layer and lies at a depth on the order of 200 μm from the surface of the semiconductor wafer for example, exhibits a small expansion rate for a small temperature rise in comparison with the surface layer, and tension is therefore generated due to the expansion of the surface layer.

(3) In the backside layer, which succeeds the intermediate layer and comprises the backside of the semiconductor wafer, compressive stress is generated due to a warping of the semiconductor wafer which arises from the surface expansion.

"Maximum tension of the semiconductor wafer" is the maximum value of the tension generated in the semiconductor wafer when the surface temperature of the semiconductor wafer is at the peak temperature as a result of being heated by preheating means and flash radiation means.

The "tense critical strength of the semiconductor wafer" is dependent on the temperature of the semiconductor wafer, and, for a semiconductor wafer formed from silicon, is said to be represented by the curve shown in FIG. 6 (also referred to as the "tense critical strength curve") which is expressed by the equation (1) below.

$$Y = 0.0001 \times T^2 - 0.355 \times T + 236.7 \qquad \text{Equation (1)}$$

[In the equation, Y represents the ultimate tensile strength (MPa), and T represents the temperature (° C.)].

Here, Equation (1) was obtained by finding through experiments on a semiconductor wafer formed from silicon the magnitude of the stress which causes damage to the semiconductor wafer that arises from tension generated within the semiconductor wafer, as well as the temperature within the semiconductor wafer, and then by finding from the results shown in Table 1 obtained through these experiments an approximation curve that indicates the relationship between the tense critical strength and the semiconductor wafer temperature and that passes through the three points shown in Table 1.

TABLE 1

| Temperature of semiconductor wafer | Tense critical strength |
|---|---|
| 600° C. | 59.7 MPa |
| 400° C. | 110.7 MPa |
| 200° C. | 169.7 MPa |

Figure 6:
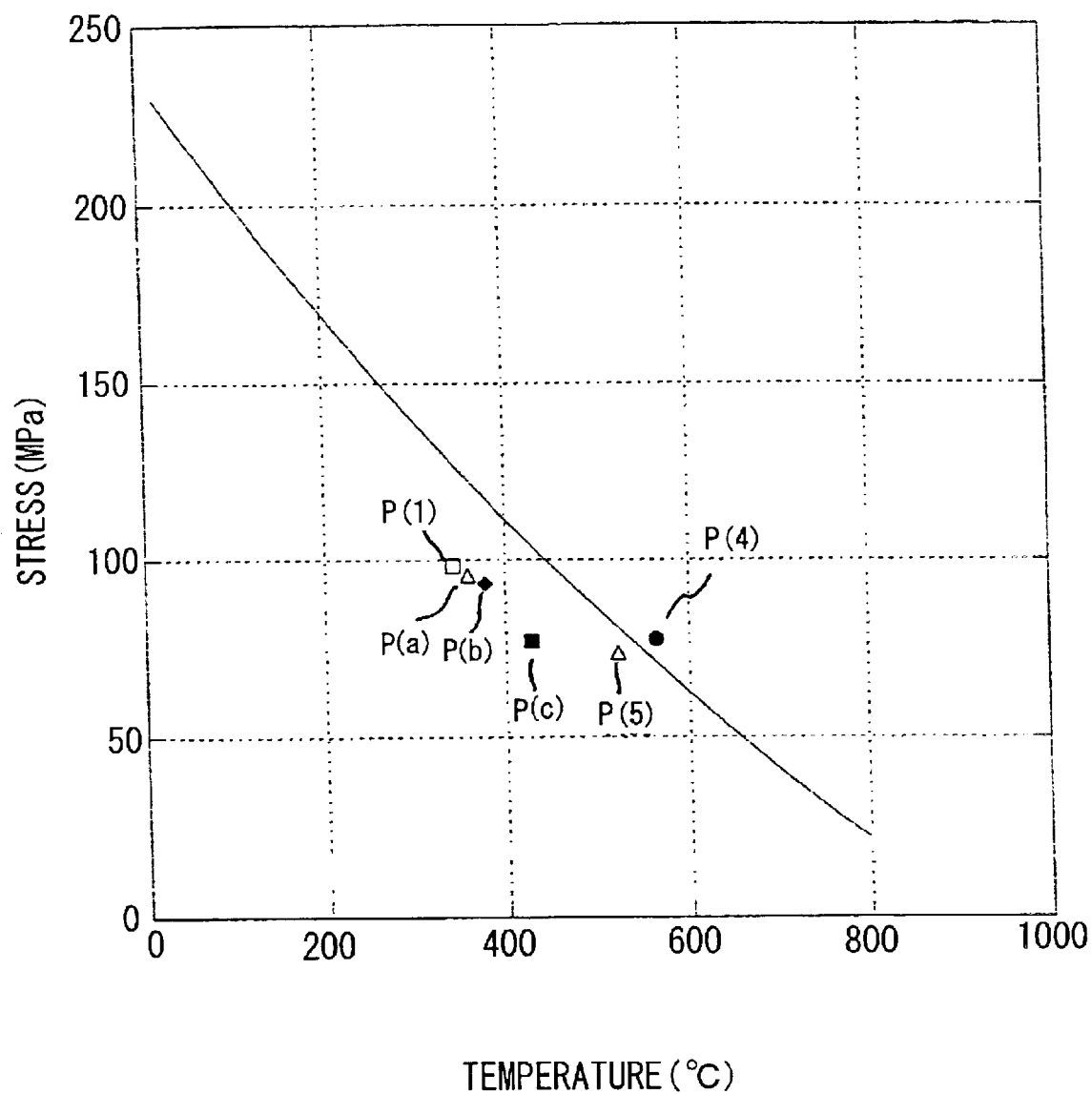
FIG. 6 is an illustrative view of a tension critical strength curve.

As shown in FIG. 6, the tense critical strength of the semiconductor wafer grows progressively smaller as the temperature rises. Therefore, the maximum tension of the semiconductor wafer and the tense critical strength of the semiconductor wafer can be compared by means of the following procedure for example.

(a) The maximum tension value and the position in which the maximum tension is generated (also referred to as the "maximum tension generation position" hereinafter) are confirmed by checking the stress distribution in the thickness direction of the semiconductor wafer when the surface temperature of the semiconductor wafer is at the peak temperature.

(b) The temperature in the maximum tension generation position is confirmed by checking the temperature distribution in the thickness direction of the semiconductor wafer when the surface temperature of the semiconductor wafer is at the peak temperature.

(c) The tense critical strength value of the semiconductor wafer itself at the temperature in the maximum tension generation position obtained in (b), and the maximum tension value obtained in (a) are compared.

In the thermal processing method, the smaller the maximum tension generated in the course of the thermal processing is in relation to the tense critical strength, the greater the degree of freedom in the heating conditions for preheating means 30 and flash radiation means 20.

The preheating temperature produced by preheating means is preferably equal to or less than 450° C. specifically.

Making the preheating temperature equal to or less than 450° C. reduces the temperature in the maximum tension generation position of the semiconductor wafer and increases the tense critical strength in the maximum tension generation position whereby damage to the semiconductor wafer can be reliably prevented.

Therefore, in cases where the preheating temperature exceeds 450° C., even if the flash irradiation by flash radiation means is completed within a very short time, the temperature in the maximum tension generation position resulting from the preheating is higher and the tense critical strength in the maximum tension generation position is accordingly smaller, which means that there is a risk of damage to the semiconductor wafer.

The preheating temperature is preferably equal to or less than 450° C., preferably in the temperature range 200 to 450° C., and more preferably 300 to 430° C.

The flash with which the semiconductor wafer is irradiated by flash radiation means is normally selected having the characteristic that when the preheating temperature is comparatively low, the peak energy of the flash irradiation waveform is large and the rise rate is high. On the other hand, when the preheating temperature is comparatively high, the flash can be selected having the characteristic that the peak energy of the flash irradiation waveform is small and the rise rate is low.

Specifically, the flash from flash radiation means preferably possesses the characteristics that the rise rate of the irradiation waveform is equal to or more than $2.0 \times 10^5$ J/mm$^2 \cdot$s$^2$ and the peak energy is equal to or less than 200 J/mm$^2 \cdot$s.

Further, more particularly, the rise rate is preferably $2.0 \times 10^5$ to $1.65 \times 10^6$ J/mm$^2 \cdot$s$^2$, When the rise rate is less than $2.0 \times 10^5$ J/mm$^2 \cdot$s$^2$, because it takes time for the surface temperature of the semiconductor wafer to reach the peak temperature, the flash irradiation time by means of flash radiation means is ultimately long and it takes a long time for the semiconductor wafer to be exposed to a high temperature. Consequently, the temperature in the maximum tension generation position of the semiconductor wafer resulting from the heating using flash radiation means is higher and the tense critical strength in the maximum tension generation position is accordingly smaller, which means that there is a risk of damage to the semiconductor wafer.

When the rise rate exceeds $1.65 \times 10^6$ J/mm$^2 \cdot$s$^2$, the problem arises that the degree of freedom in the constitution of flash radiation means becomes so small as to become impractical and the flash discharge lamps constituting flash radiation means are subject to a large load thereby reducing the lifespan thereof.

Meanwhile, the peak energy can be made 200 J/mm$^2 \cdot$s or more, but then a variety of problems arise, namely that the members that constitute flash radiation means are more numerous and the constitution becomes complicated for example, and moreover high maintainability cannot be achieved or costs are raised.

In the method for thermal processing a semiconductor wafer according to the present invention, the heating conditions for preheating means and flash radiation means can include the conditions indicated in (1) to (3) which follow for example, but condition (3) is preferable.

(1) The rise rate of the irradiation waveform should be set at $1.65 \times 10^6$ J/mm$^2 \cdot$s$^2$, the peak energy at 340 J/mm$^2 \cdot$s, and the preheating temperature at 300° C.

(2) The rise rate of the irradiation waveform should be set at $1.0 \times 10^6$ J/mm$^2 \cdot$s$^2$, the peak energy at 250 J/mm$^2 \cdot$s, and the preheating temperature at 300° C.

(3) The rise rate of the irradiation waveform should be set at $2.0 \times 10^5$ J/mm$^2 \cdot$s$^2$, the peak energy at 200 J/mm$^2 \cdot$s, and the preheating temperature at 300° C.

According to the method for thermal processing a semiconductor wafer by means of the thermal processing apparatus 10 thus constituted, because the surface layer comprising the surface layer region of the semiconductor wafer being processed is flash heated by means of flash radiation means 20 after being heated by means of preheating means 30 by controlling the preheating temperature produced by preheating means 30, even if the temperature is raised to the desired temperature, the temperature rise in the maximum tension generation position in the intermediate layer below the surface layer is suppressed and the maximum tension of the semiconductor wafer which is generated in this maximum tension generation position can therefore be made lower than the tense critical strength of the semiconductor wafer itself thereby suppressing damage to the semiconductor wafer that arises from tension produced within the semiconductor wafer during thermal processing.

Thermal processing can therefore be performed without damaging the semiconductor wafer being processed.

Flash radiation means 20 constituted by the flash discharge lamps 50 as the heat source is used and therefore the time required to heat the surface of the semiconductor wafer to the desired temperature is very short thereby permitting the suppression of impurity thermal diffusion. Accordingly, even when the impurity diffusion layer to be formed is very shallow in the range of 10 to 20 nm for example, thermal processing can be performed without damaging the semiconductor wafer being processed.

In this method for thermal processing a semiconductor wafer, the heating conditions are such that the rise rate of the irradiation waveform of flash radiation means 20 is equal to or greater than $2.0 \times 10^5$ J/mm$^2 \cdot$s$^2$, and the peak energy is equal to or less than 200 J/mm$^2 \cdot$s. Further, by making the preheating temperature of preheating means 30 equal to or less than 450° C., thermal processing can be reliably performed without damaging the semiconductor wafer being processed and can be put into practical use without problems.

Thus, though the present invention has been described with reference to specific embodiments, the present invention is not limited to or by the examples above, various modifications being possible.

For example, in this method for thermal processing a semiconductor wafer, for a semiconductor wafer having a thickness of 0.5 to 0.8 mm, the maximum tension is normally generated in the range 0.18 to 0.28 mm from the surface of the semiconductor wafer, and it is therefore possible to perform heating by means of preheating means using a preheating temperature capable of controlling that the maximum value of the tension produced within this range is less than the tense critical strength of the semiconductor wafer itself. In this case also, it is possible to obtain the operational effect of being able to perform thermal processing without damaging the semiconductor wafer being processed.

The method for thermal processing a semiconductor wafer according to the present invention has been described hereinabove using a thermal processing apparatus that comprises flash radiation means and preheating means but the method for thermal processing a semiconductor wafer is not limited to or by such an apparatus.

The experiments performed in order to confirm the operational effects of the present invention will be described below.

EXAMPLE 1

An experimental thermal processing apparatus was created in accordance with the constitutional form shown in FIG. 1, comprising flash radiation means provided with twenty-one rod-shaped flash discharge lamps connected to a common trigger circuit as the heat source, and preheating means provided with seventeen rod-shaped halogen lamps with a power consumption of 1.7 kW.

Figure 7:
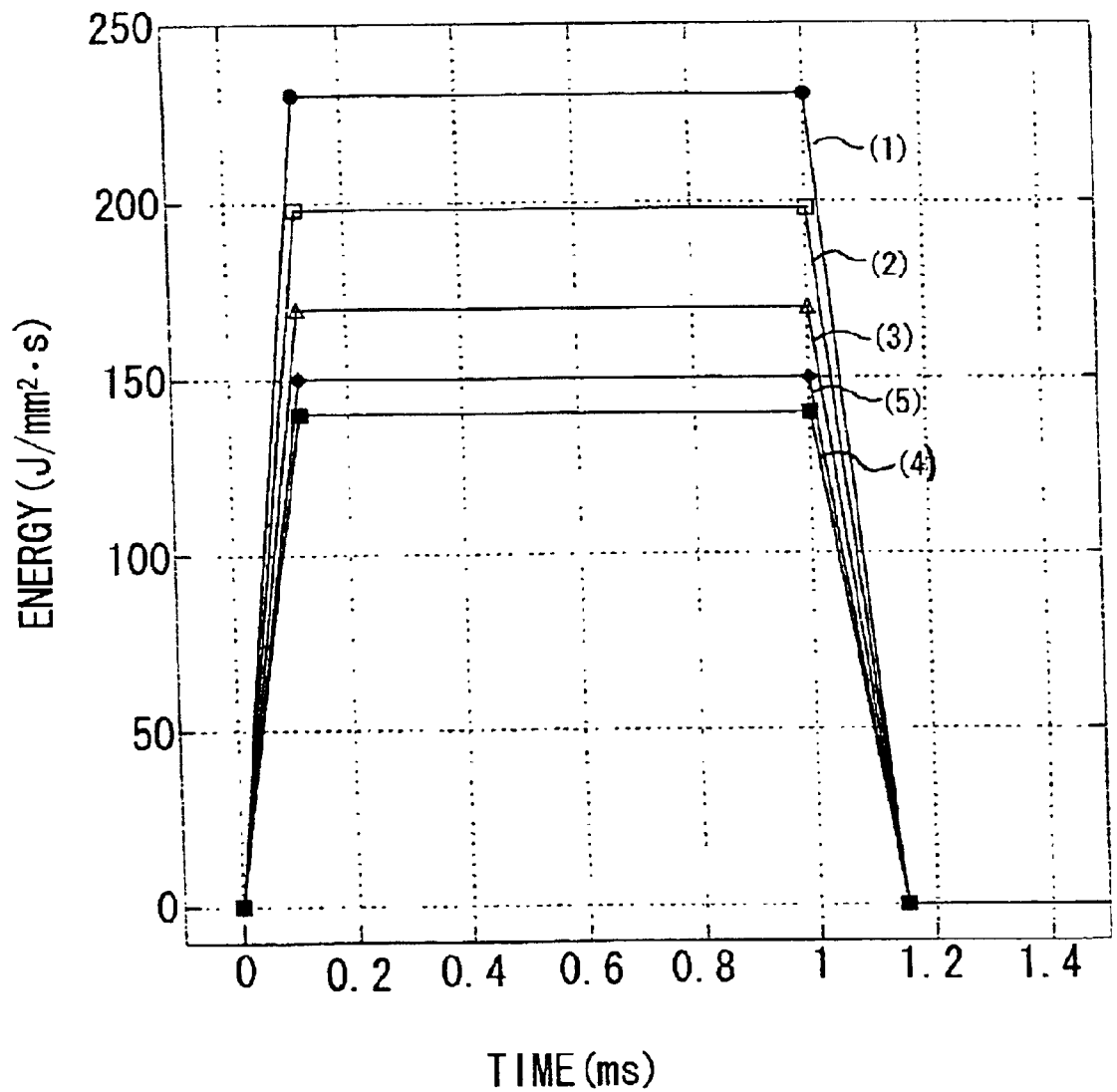
FIG. 7 is an illustrative view of irradiation waveforms of the flash with which the semiconductor wafer is irradiated by flash radiation means according to a first embodiment.

The products processed in this experimental thermal processing apparatus were semiconductor wafers formed from silicon and having an aperture of 200 mm and a thickness of 0.6 mm. These semiconductor wafers were preheated by preheating means to 200° C., 300° C., 400° C., 450° C., and 500° C. respectively and then, as shown in Table 2, irradiated by flash radiation means with a flash the irradiation waveform of which is shown in FIG. 7 and which was adjusted so that the peak temperature at the semiconductor wafer was 1100° C. The temperature distribution in the thickness direction of the semiconductor wafer when the surface temperature of the semiconductor wafer was at the peak temperature was then measured. The results are shown in FIG. 8.

Figure 8:
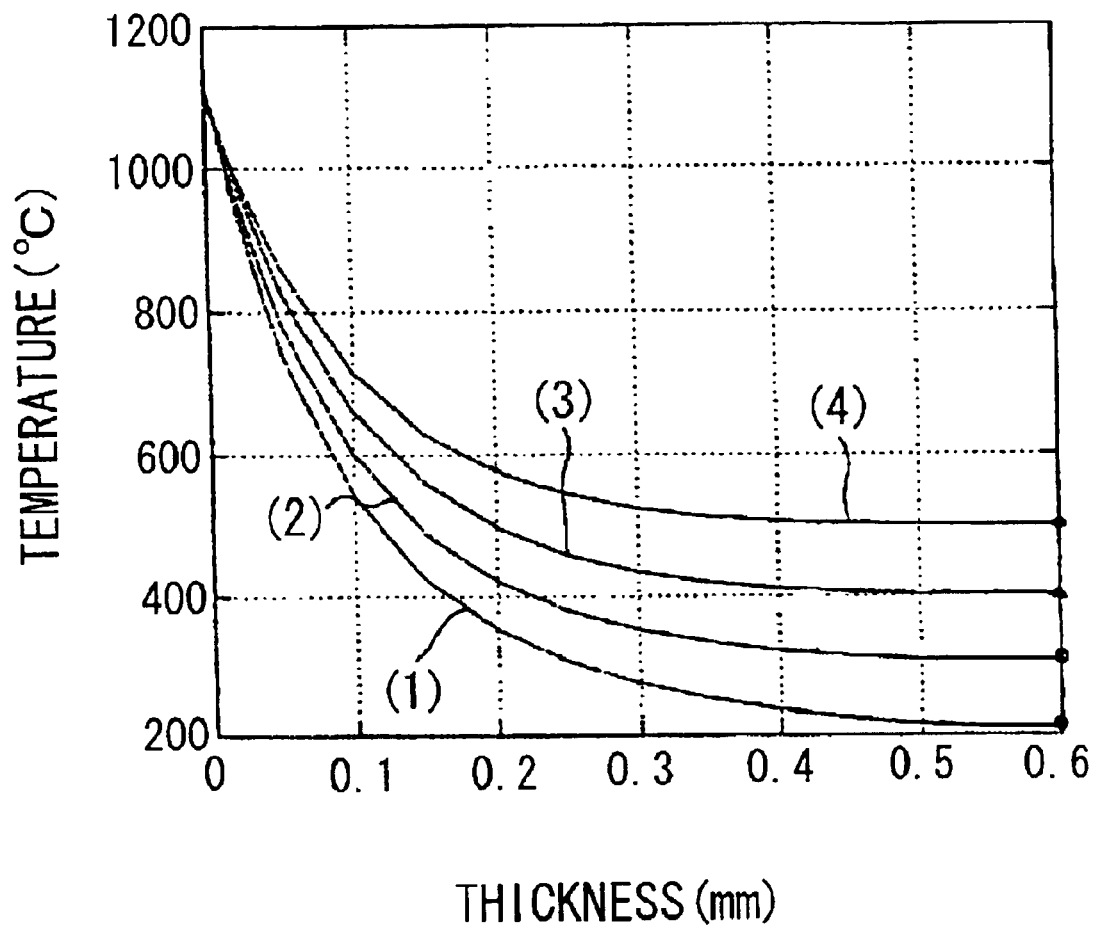
FIG. 8 is an illustrative view of the temperature distribution in the thickness direction of the semiconductor wafer whose surface temperature is at the peak temperature, according to the first embodiment.

The value 0 on the horizontal axis of the temperature distribution graph of FIG. 8 represents the surface of the semiconductor wafer, and the value 0.6 represents the backside of the semiconductor wafer. The preheating temperature of 450 has been omitted from FIG. 8.

Figure 9:
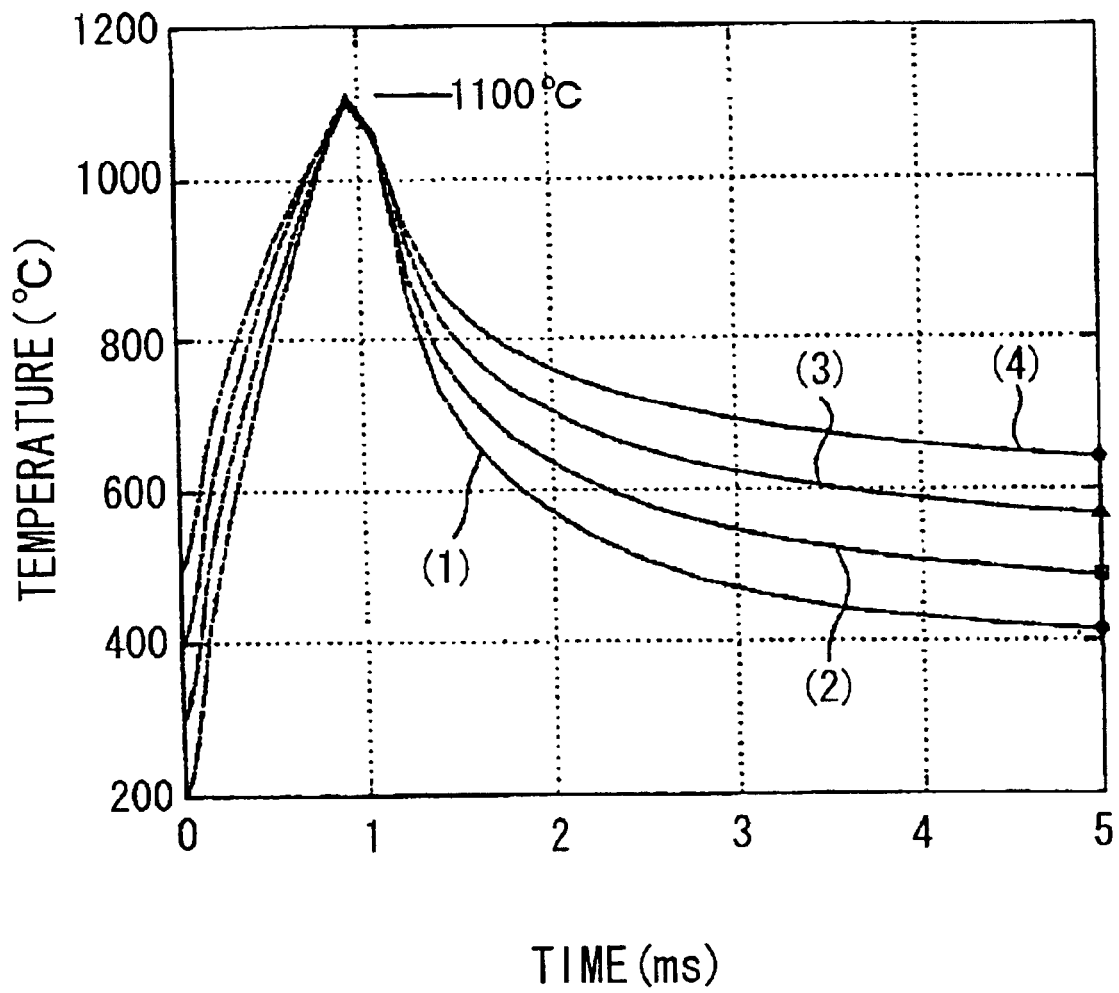
FIG. 9 is an illustrative view of the variation in the surface temperature of the semiconductor wafer during the thermal processing according to the first embodiment.

Further, when the surface temperature with respect to time during thermal processing of the semiconductor wafer was confirmed, the peak temperature of the surface temperature of the semiconductor wafer was found to be 1100° C. The results are shown in FIG. 9.

TABLE 2

| Preheating temperature (° C.) | 200 | 300 | 400 | 500 |
|---|---|---|---|---|
| Flash irradiation waveform type | (1) | (2) | (3) | (4) |
| Peak energy of the irradiation waveform (J/mm$^2$ · S) | 230 | 200 | 170 | 140 |

Furthermore, measurement was performed of the stress distribution in the thickness direction of the semiconductor wafer when the surface temperature of the semiconductor wafer, given a preheating temperature of 200° C. and 500° C. respectively, was at the peak temperature, this stress distribution being confirmed together with the temperature distribution in the thickness direction of the semiconductor wafer. The results are shown in FIG. 10.

Figure 10:
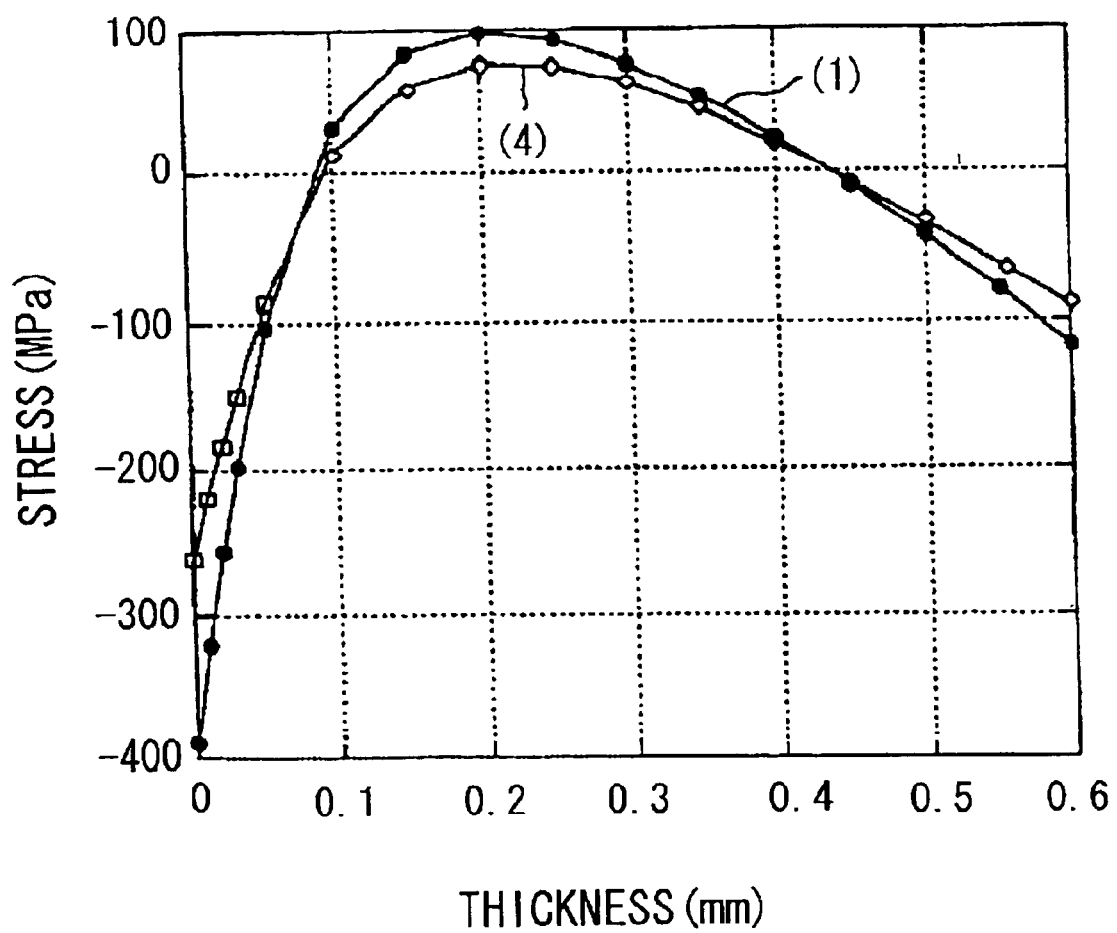
FIG. 10 is an illustrative view of the stress distribution in the thickness direction of the semiconductor wafer whose surface temperature is at the peak temperature, according to the first embodiment.

Positive values on the vertical axis of the stress distribution graph of FIG. 10 indicate the magnitude of the tension, whereas negative values indicate the magnitude of the compressive stress. Also, the value 0 on the horizontal axis indicates the surface of the semiconductor wafer, and the value 0.6 indicates the backside of the semiconductor wafer.

Then, the maximum tension value and the maximum tension generation position were specified as per FIG. 10, and the temperature in the maximum tension generation position was specified as per FIG. 8, whereupon the maximum tension in FIG. 6, which shows a silicon (Si) tense strength curve, and the tense critical strength were compared.

In FIG. 6, a plotted point for a case where the preheating temperature is 200° C. is shown as P(1), a plotted point for a case where the preheating temperature is 500 is shown as P(4), and a plotted point for a case where the preheating temperature is 450° C. is shown as P(5).

It was confirmed from the results above that by lowering the preheating temperature the amount of energy for the flash irradiation that is required to raise the peak temperature of the semiconductor wafer to the desired temperature increases and the maximum tension thus generated increases, but that because the temperature in the maximum tension generation position of the semiconductor wafer then falls, the tense critical strength in this maximum tension generation position increases.

It was then confirmed that in cases where the preheating temperature is 500° C., the maximum tension is also larger than the tense critical strength and there is a great risk of damage to the semiconductor wafer.

EXAMPLE 2

An experimental thermal processing apparatus having a constitution like that employed in Example 1 was used, and products processed in this experimental thermal processing apparatus were semiconductor wafers formed from silicon having an aperture of 200 mm and a thickness of 0.6 mm. These semiconductor wafers were preheated by preheating means to 300 and then, irradiated by flash radiation means with a flash the irradiation waveform of which is shown in FIG. 11. The temperature distribution and the stress distribution in the thickness direction of the semiconductor wafer when the surface temperature of the semiconductor wafer was at the peak temperature were then measured. The results are shown in FIGS. 12 and 13.

Figure 12:
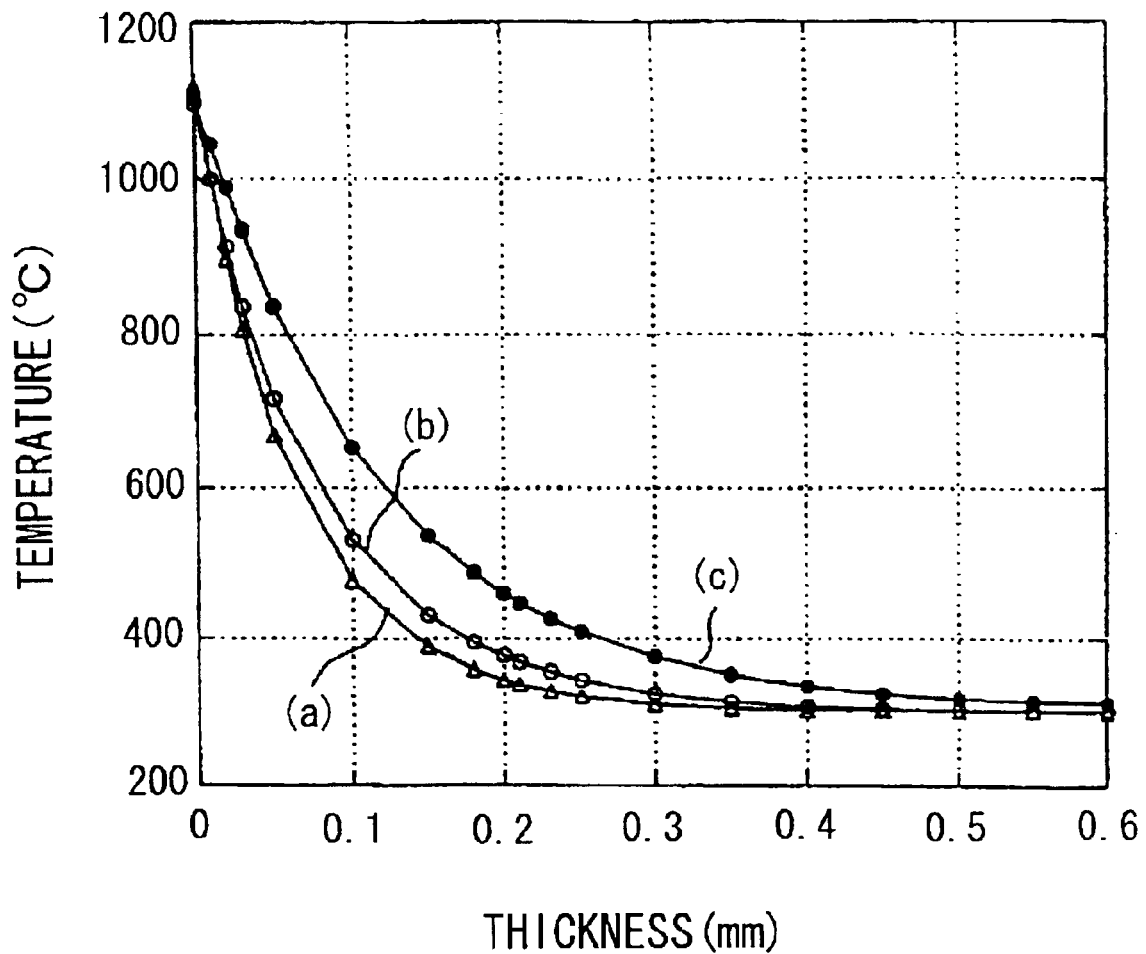
FIG. 12 is an illustrative view of the temperature distribution in the thickness direction of the semiconductor wafer whose surface temperature is at the peak temperature, according to the second embodiment.
Figure 13:
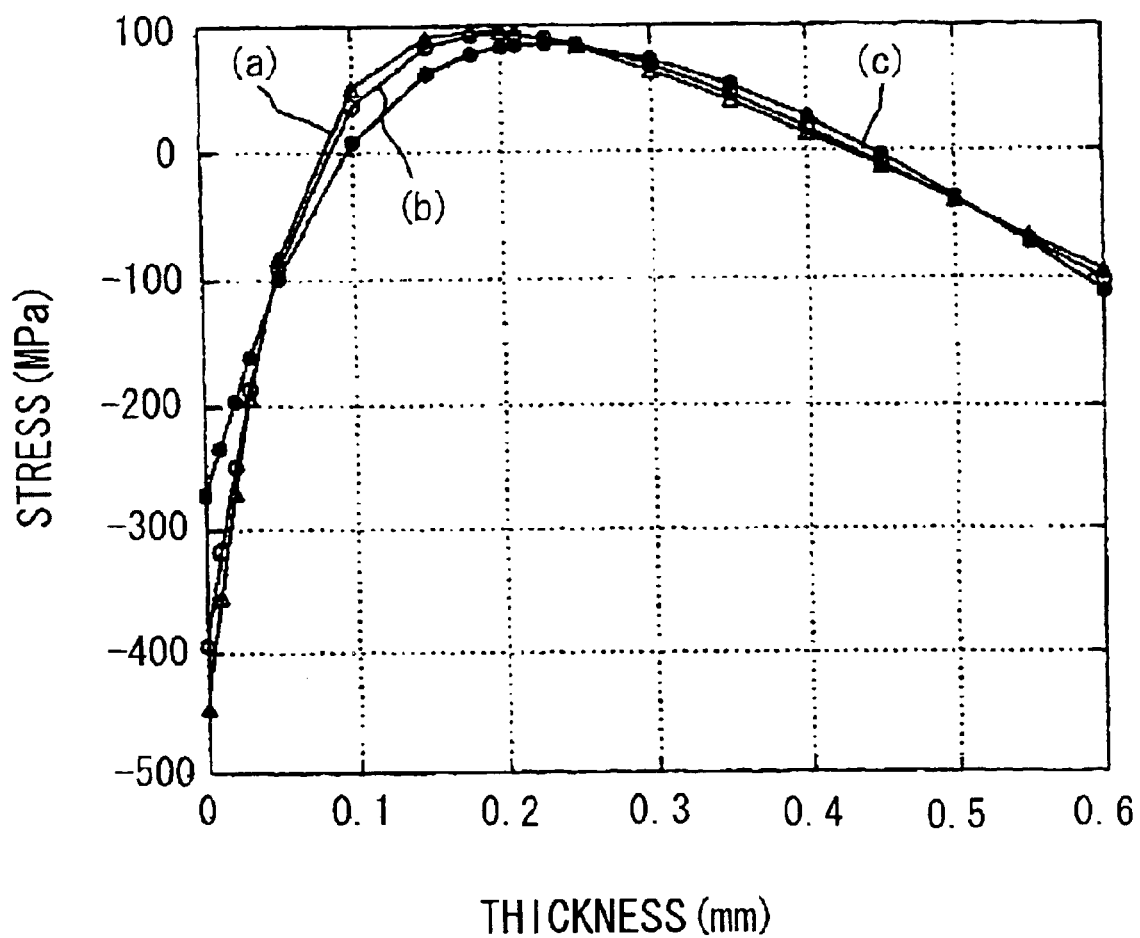
FIG. 13 is an illustrative view of the stress distribution in the thickness direction of the semiconductor wafer whose surface temperature is at the peak temperature, according to the second embodiment.
Figure 14:
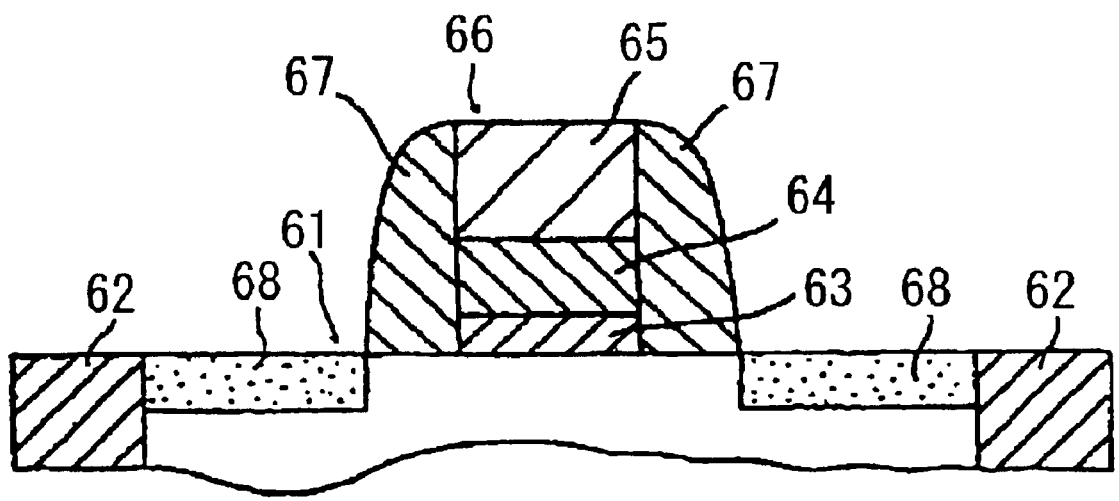
FIG. 14 is an illustrative cross-sectional view emphasizing the structure of a transistor element formed in a semiconductor wafer.

The value 0 on the horizontal axis of the temperature distribution graph of FIG. 12 and of the stress distribution graph of FIG. 13 represents the surface of the semiconductor wafer, and the value 0.6 represents the backside of the semiconductor wafer. Further, positive values on the vertical axis of the stress distribution graph of FIG. 13 indicate the magnitude of the tension, whereas negative values indicate the magnitude of the compressive stress.

Then, the maximum tension value and the maximum tension generation position were specified as per FIG. 13, and the temperature in the maximum tension generation position was specified as per FIG. 12, whereupon the maximum tension in FIG. 6, which shows a silicon (Si) tense strength curve, and the tense critical strength were compared. The respective values thus specified are shown in Table 3 below.

In FIG. 6, a plotted point for a case where the irradiation waveform is represented by curve (a) in FIG. 11 is shown as P(a), a plotted point for a case where the irradiation waveform is represented by curve (b) in FIG. 11 is shown as P(b), and a plotted point for a case where the irradiation waveform is represented by curve (c) in FIG. 11 is shown as P(c).

TABLE 3

| Maximum tension generation position | Maximum tension | Temperature in maximum tension generation position | Irradiation waveform type |
|---|---|---|---|
| 0.18 mm | 95.4 MPa | 358° C. | (a) |
| 0.2 mm | 93 MPa | 373° C. | (b) |
| 0.23 mm | 77 MPa | 427° C. | (c) |

"Maximum tension generation position" in Table 3 indicates the position from the surface of the semiconductor wafer.

Further, a semiconductor wafer formed from silicon and having a thickness of 0.8 mm was processed, and, similarly to the above method, the maximum tension values, the maximum tension generation position and the temperature in the maximum tension generation position were specified. The respective values thus specified are shown in Table 4 below.

When the specified maximum tension values were compared with the tense critical strength values using the silicon (Si) tense strength curve shown in FIG. 6, the maximum tension values were found to be smaller than the tense critical strength values.

TABLE 4

| Maximum tension generation position | Maximum tension | Temperature in maximum tension generation position | Irradiation waveform type |
|---|---|---|---|
| 0.23 mm | 86.3 MPa | 328° C. | (a) |
| 0.26 mm | 88.3 MPa | 342° C. | (b) |
| 0.28 mm | 91.1 MPa | 388° C. | (c) |

"Maximum tension generation position" in Table 4 indicates the position from the surface of the semiconductor wafer.

It was confirmed from the results above that by reducing the rise rate the temperature in the maximum tension generation position increased, and that there was a tendency for the tense critical strength in the maximum tension generation position to be reduced, but that, given any of the heating conditions of Example 2, damage to the semiconductor wafer could be adequately prevented.

It was also confirmed that a very shallow impurity diffusion layer could be formed given any of the heating conditions of Example 2, and that the maximum tension was generated in the range 0.18 to 0.28 mm from the surface of the semiconductor wafer.

According to the method for thermal processing a semiconductor wafer according to the present invention, heating is performed by means of preheating means that control a preheating temperature such that the maximum tension of the semiconductor wafer generated by thermal expansion thereof is less than the tense critical strength of the semiconductor wafer itself, when the semiconductor wafer is heated by means of heating using flash radiation means constituted by a flash discharge lamp after the semiconductor wafer is preheated to a predetermined temperature by means of preheating means. As a result, damage to the semiconductor wafer which arises from tension produced within the semiconductor wafer during thermal processing can be suppressed. Thermal processing that does not damage the semiconductor wafer being processed can therefore be performed.

Moreover, flash radiation means that are constituted having a flash discharge lamp as the heat source is used and therefore the time required to heat the surface of the semiconductor wafer to the desired temperature is very short thereby permitting the suppression of impurity thermal diffusion.

What is claimed is:

1. A method for thermal processing a semiconductor wafer, wherein the semiconductor wafer is heat-treated by means of flash radiation means constituted by a flash discharge lamp after preheating the semiconductor wafer to a predetermined temperature by means of preheating means, comprising preheating the semiconductor wafer at a preheating temperature selected to insure that a maximum value of tension to be generated in an intermediate range of 0.18 to 0.28 mm from a surface of the semiconductor wafer when the semiconductor wafer is irradiated with the flash radiation from the flash discharge lamp is less than a tensile critical strength of the semiconductor wafer, and then heat-treating the semiconductor wafer by the flash radiation provided by the flash discharge lamp, the flash has a rise rate of an irradiation waveform of the flash radiation equal to or more than $2.0 \times 10^5$ J/mm$^2$·s$^2$ and a peak energy equal to or less than 200 J/mm$^2$·s.

2. The method as claimed in claim 1, wherein the preheating temperature by said preheating means is set to be equal to or less than 450° C.

* * * * *